(12) United States Patent
Friedel et al.

(10) Patent No.: US 7,091,772 B2
(45) Date of Patent: Aug. 15, 2006

(54) POWER AMPLIFICATION BY USING DIFFERENT FIXED POWER SUPPLY SIGNALS FOR THE AMPLIFIER

(75) Inventors: Bernd Friedel, Markt Bibart (DE); Kai-Uwe Ritter, Bavaria (DE)

(73) Assignee: Lucent Technologies Inc., Murray Hill, NJ (US)

( * ) Notice: Subject to any disclaimer, the term of this patent is extended or adjusted under 35 U.S.C. 154(b) by 51 days.

(21) Appl. No.: 10/601,491

(22) Filed: Jun. 23, 2003

(65) Prior Publication Data
US 2004/0008081 A1    Jan. 15, 2004

(30) Foreign Application Priority Data
Jul. 9, 2002    (EP)    ................................. 02254808

(51) Int. Cl.
*H03F 3/38*    (2006.01)
*H04B 1/04*    (2006.01)

(52) U.S. Cl. .................. 330/10; 330/127; 330/136; 455/127.1

(58) Field of Classification Search ............... 330/10, 330/123, 127, 129, 136, 199, 297
See application file for complete search history.

(56) References Cited

U.S. PATENT DOCUMENTS

| | | | | |
|---|---|---|---|---|
| 5,142,240 A | * | 8/1992 | Isota et al. | 330/136 |
| 5,442,317 A | * | 8/1995 | Stengel | 330/10 |
| 5,826,170 A | * | 10/1998 | Hirschfield et al. | 330/129 |
| 5,898,342 A | * | 4/1999 | Bell | 330/297 |
| 6,028,486 A | * | 2/2000 | Andre | 330/297 |
| 6,043,707 A | | 3/2000 | Budnik | 330/10 |
| 6,069,525 A | | 5/2000 | Sevic et al. | 330/51 |
| 6,157,253 A | * | 12/2000 | Sigmon et al. | 330/10 |
| 6,160,441 A | * | 12/2000 | Stratakos et al. | 330/273 |
| 6,166,598 A | * | 12/2000 | Schlueter | 330/127 |
| 6,188,276 B1 | * | 2/2001 | Simopoulos | 330/10 |
| 6,449,465 B1 | * | 9/2002 | Gailus et al. | 330/10 |
| 6,636,112 B1 | * | 10/2003 | McCune | 330/10 |
| 6,694,130 B1 | * | 2/2004 | Loke et al. | 330/129 |
| 6,781,452 B1 | * | 8/2004 | Cioffi et al. | 330/10 |

FOREIGN PATENT DOCUMENTS

| | | |
|---|---|---|
| GB | 2 356 095 A | 5/2001 |
| WO | WO 02/17478 A1 | 2/2002 |

* cited by examiner

*Primary Examiner*—Khanh Van Nguyen

(57) ABSTRACT

The present invention proposes a power amplification under variable envelope excitation, wherein an original input signal at least is converted into a phase modulated signal part, at least the phase modulated signal part is fed to an input port of an amplifier unit, the input signal is amplified by dynamically selecting a fixed power supply (PSU 1, PSU 2, PSU 3) for the amplifier unit, and wherein the amplitude content of the original input signal is reconstructed by changing dependent on the respective provided power supply a further controllable input of the amplifier unit, in particular the input power level ($P_{in}$) and/or the biasing voltage ($U_g$) and/or biasing current at the control input of the amplifier unit, during said step of amplifying.

8 Claims, 4 Drawing Sheets a) 400mA, var.supply, onboard Za
b) 400mA, swi.supply at 3dB back off, var. $P_{in}$
c) 400mA, swi.supply at 4dB back off, var. $P_{in}$
d) 400mA, 26V supply, onboard Za a) 400mA, var.supply,onboard Za
b') 400mA, swi.supply at 3dB back off, var. $U_g$
c') 400mA, swi.supply at 4dB back off, var. $U_g$
d) 400mA, 26V supply,onboard Za

POWER AMPLIFICATION BY USING DIFFERENT FIXED POWER SUPPLY SIGNALS FOR THE AMPLIFIER

CROSS REFERENCE TO RELATED APPLICATION

This application claims priority of European Patent Application No. 02254808.5 filed on Jul. 9, 2002.

TECHNICAL FIELD

The present invention relates to power amplification.

BACKGROUND OF THE INVENTION

Conventionally, power amplifier concepts operate the power amplifiers with fixed input and output loads. These loads are usually chosen such that the gain, the output power or the efficiency is optimized depending on the need of the specific application. In particular regarding mobile communication systems, such an application may be a battery-powered amplifier in a user equipment or mobile station or may be an amplifier for a base station.

In case of battery powered amplifier the load usually is chosen such that the efficiency is optimized, wherein in case of an amplifier for a base station the optimization for a maximum output power is needed.

Normally it is not possible to get an optimum for all the above-mentioned three parameters at the same time as each of these parameters is requiring at least a slightly different input/output matching network.

For signals with a peak power to average power ratio of one, such as a frequency modulated (FM) or phase modulated (PM) signal or a GMSK (Gaussian Minimum Shift Keying) signal used in a GSM (Global System for Mobile communication) system, this conventional design concept usually works well as the power amplifier operates all the time near its maximum output power, where the amplifier yields a high efficiency so that the loads which have to be chosen for an optimum output power and an optimum efficiency normally are not very different.

For the signals however, with high peak to average power ratios, the power amplifier has to be operated most of the time at an output power level that is some dB below the maximum output power, such as for example 8 to 10 dB below the peak power for a W-CDMA (Wideband-Code Division Multiple Access) signal in the downlink path. For the average power level the transistor efficiency is only a small part, for example one fifth, of that efficiency at maximum output power. Hence for signals with high peak to average ratios, most of the consumed DC power is dissipated in heat and only a small part of this DC power is converted to the wished RF power. As a consequence, the high DC power increases operating costs and the large amount of dissipated heat increases costs for the amplifier cooling equipment including operating costs for active cooling systems, such as air conditioning, and material costs for bigger heat-sinks and better heat conducting materials.

Consequently, from a standpoint of costs and environmental friendly design, it is advantageous to have a power amplifier that has an efficiency that is as high as possible for signals with high peak to average ratios.

Known concepts for enhancing the efficiency of a power amplifier under variable envelope excitation are in particular the concept according to the Doherty amplifier, to the Chireix's outphasing amplifier, to the Envelope Elimination and Restoration (EER), as invented by Kahn, and to the Bias adaptation.

Regarding the Doherty amplifier in more detail, two amplifiers with a special combining network are used. The amplifiers are called main amplifier and auxiliary amplifier. For output power levels close to the combined maximum output power of both transistors, both amplifiers are active. As the output power is reduced, the auxiliary amplifier shuts down at a certain level and generates no more RF power, whereas the main amplifier is still active. Such a shut down is typically at 6 dB below the maximum combined output power. For this power back-off condition the main amplifier is near its maximum output power and thus the efficiency is almost at its optimum. However, one of the most drawbacks of this concept is, that two amplifiers with a special controlling and combining network are needed.

Regarding the Chireix's outphasing amplifier, the amplitude modulation of an input signal that causes the high peak to average power ratio is converted to a phase modulation. This converting process is done at baseband frequencies usually by employing digital processing, wherein the converting process generates two phase-modulated signals that have to be processed in parallel up to the output of the amplifier unit. As these two signals contain only phase modulation, highly non-linear amplifiers can be used that yield good efficiency. The original signal with its original phase modulation content and original amplitude modulation content is reconstructed at the output of both non-linear amplifiers with help of a special combining network. As a disadvantageous consequence, two complete amplifier chains from the baseband up to the output of the amplifier unit are necessary and the combining network at the output is difficult to realize.

By using the known concept of envelope elimination and restoration (EER), the amplitude modulation of the amplifier input signal is sensed via an envelope detector. Then the amplitude modulation is taken from the input signal by passing it through a limiter. The phase modulation of the input signal is preserved by this process. As the input signal to the amplifier then contains only phase modulation, a high efficient non-linear amplifier can be used. The amplitude modulation of the original signal is restored at the output of the amplifier by changing the amplifiers supply voltage according to the envelope detector output voltage. The efficiency enhancement is based on the fact that an amplifier efficiency is best when the amplifier supply voltage is just as high to accommodate the necessary voltage swing at the amplifier load.

However, the controlling of the supply voltage or current for the amplifier is difficult to achieve because of the speed of the necessary voltage and current changes. Furthermore, the efficiency of the necessary DC/DC converter worsens the efficiency budget of the whole amplifier unit.

Thus the drawbacks of the known EER technique are lying mainly in the fact, that even the most recent DC/DC converters are not able to provide the fast changes in the amplifier supply voltage and/or current needed to reconstruct the amplitude of the original signal at the amplifier unit output, which holds true especially for broadband signals like a UMTS (Universal Mobile Telecommunication System) signal with high power amplifiers.

Finally, the bias adaptation concept is in principle the same as the envelope elimination and restoration, but a conventional linear RF-amplifier is used instead of a saturated amplifier. Accordingly, the amplitude content is not removed from the input signal.

SUMMARY OF THE INVENTION

It is an object of the invention to provide in particular with regard to the above discussed state of the art, a new and improved efficiency enhanced power amplifier approach resulting in further reduced operational costs, lower efforts for thermal management for the amplifier unit itself and the component in which the amplifier is embedded and in the possibility to design more environmental friendly amplifiers, especially suitable for applications within wireless systems, cellular networks, terrestrial broadcasting systems and satellite based transmission systems.

The inventive solution of the object is achieved by a method and/or a power amplifier according to the independent claims.

Accordingly, the invention proposes to perform power amplification under variable envelope excitation in that an original input signal is converted at least into a phase modulated input signal part, wherein at least the phase modulated input signal part is fed to the input port of an amplifier unit for amplifying the input signal by an individual or dynamical selection of a fixed supply power for the amplifier unit, wherein the amplitude content of the original input signal is reconstructed by changing dependent on the respective provided supply power a further controllable amplifier unit input signal, preferably the power level of the amplifier unit and/or the amplifier input biasing voltage and/or biasing current, during said step of amplifying.

Thus in particular by using the inventive power amplifier comprising at least a final amplifier unit, means for feeding at least a phase modulated input signal part to the rf-input port of the amplifier unit, at least two selectable power supply units with different fixed output signals connected, in particular in parallel, to the supply port of the amplifier unit, means for dynamically selecting a total supply power signal by selecting the respective power supply unit(s) and means for controlling dependent on the respective selected supply power signal a further amplifier unit input, in particular the input power level and/or a biasing voltage and/or biasing current at the control input of the amplifier unit, the speed requirement associated with the variable supply power signal can be bypassed and the inventive concept can be realized with currently available components and design techniques.

Consequently, the amplifier supply power signal is not used to reconstruct the amplitude part of the original input signal by continuously changing the amplifiers power supply according to the amplitude content of the original input signal, but is only used to provide the amplifier with various fixed supply power signals, in particular with fixed supply voltages or supply currents to mainly increase the amplifiers efficiency for lower output power levels.

Thus for the reconstruction of the amplitude content the inventive approach, in particular by changing the amplifiers biasing voltage and/or current at the control input or by changing the amplifiers input power level for different fixed supply voltages or currents depending on the respective used type of amplifier unit, to reconstruct the amplitude content of the original signal at the amplifier units output is by far easier to handle than the reconstruction of the amplitude content with help of the amplifiers supply voltage.

In particular, by using for the power supply units DC/DC converters and a digital signal processor for controlling the selection of these converters the individually selecting of fixed amplifying supply power signals can be performed easily by switching at least between two different fixed supply signals, such as between fixed supply voltages or supply currents, with the difference in providing amplifier gain thereby taken into account.

Moreover, the efficiency of a DC/DC converter providing a fixed supply power is better than the efficiency of a DC/DC converter providing a huge output range. Hence the optimization for a certain behavior such as efficiency or load regulation is easier as the converters need to output only a fixed voltage or current, so this benefits the efficiency of the overall amplifier unit including the power supplies.

In particular with regard to the reconstruction of the amplitude content by use of controlling the amplifier units bias, an inefficient linear regulator can be used to control the amplifiers biasing voltage and/or current at the control input as the DC power needed at the amplifier control input for biasing the amplifier is in general negligible compared to the DC power needed to generate the RF power.

Moreover, by using a linear regulator the speed of the signal envelope is no great deal anymore since linear regulators can be designed to be very fast.

Furthermore, the amplifier is advantageously operated with a phase modulated input signal in a not over driven state to achieve an efficiency enhancement to achieve the necessary dynamics at the amplifiers output.

According to advantageous refinements, a non-linearity of the system can be compensated by pre-distorting the supply signal for the amplifier unit and/or by pre-distorting the amplifier units biasing voltage and/or biasing current at the control input, so that the inventive approach of power amplification offers two ways to linearize the amplifier unit, whereas most of other efficiency enhancement or linearization techniques offer only one way to influence the linearity of the amplifier.

The inventive power amplifier advantageously comprises a digital signal processor forming the means for controlling the variation of the amplifier units input power level and/or wherein the means for controlling the variation of the amplifier units biasing voltage and/or biasing current at the control input comprises the digital signal processor and a D/A converter, wherein the digital signal processor is advantageously also used as the control means for selecting the respective power supply unit. Moreover, the pre-distortion itself can be performed in a digital signal processor.

In praxis, it is proposed to convert the original input signal additionally into an amplitude modulated signal part, according to which a variation of the input power level can be adjust easily.

Moreover, according to advantageous refinements it is proposed to lowpass filtering the control signal for providing the respective amplifier units biasing voltage and/or biasing current of the control input, advantageously with a cut off frequency close to the modulation bandwidth of the original input signal, so that noise injected into the amplifier via the control line can be limited, such as for example the quantization noise of a digital to analogue converter that transforms the digital control information coming, in advantageous embodiments, from the afore proposed digital signal processor to the analogue voltage controlling the bias of the amplifier control input.

Consequently, some of the main merits of the inventive efficiency enhanced power amplification approach are the reduced operational costs including lower energy consumption, the lower efforts for thermal management, for the amplifier itself and the component the amplifier is embedded within as well as the possibility to design more environmental friendly amplifiers which is in particular important for wireless systems, cellular networks, terrestrial broadcasting systems and satellite based transmission systems.

BRIEF DESCRIPTION OF THE DRAWINGS

The present invention will be better understood from reading the following description of non-limiting embodiments, with reference to the attached drawings, wherein below.

It should be emphasized that the drawings of the instant application are not to scale but are merely schematic representations, and thus are not intended to portray the specific dimensions of the invention, which may be determined by skilled artisans through examination of the disclosure herein.

DETAILED DESCRIPTION

With regard to the following exemplar description and to form a basis for an easier understanding of the inventive approach, reference is made in particular to the afore-discussed known efficiency enhancement concept EER (Envelope Elimination and Restoration), according to which the amplifier input signal is converted to a purely phase modulated signal and the amplitude modulated part of the input signal is processed separately.

Figure 1:
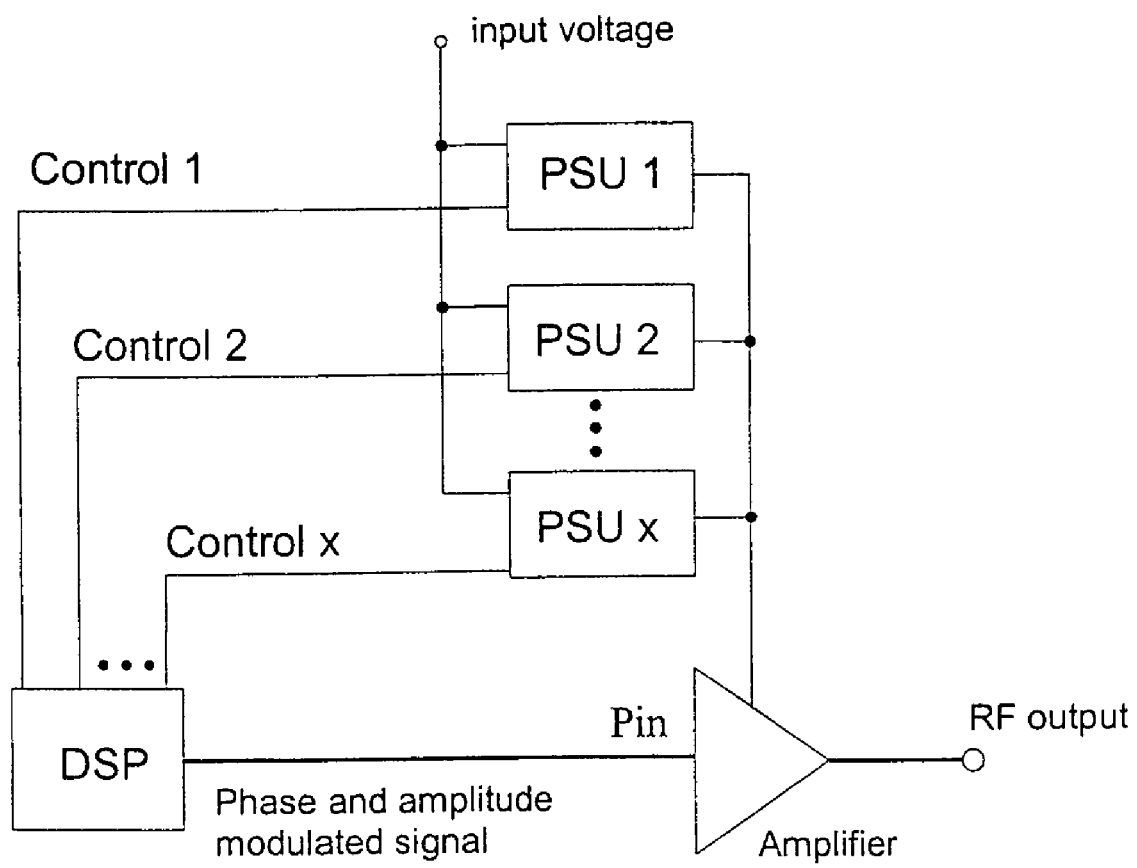
FIG. 1 is a block diagram showing the principle concept of the inventive approach using a variable amplifier input power for the purpose of reconstruction of the amplitude content.
Figure 3:
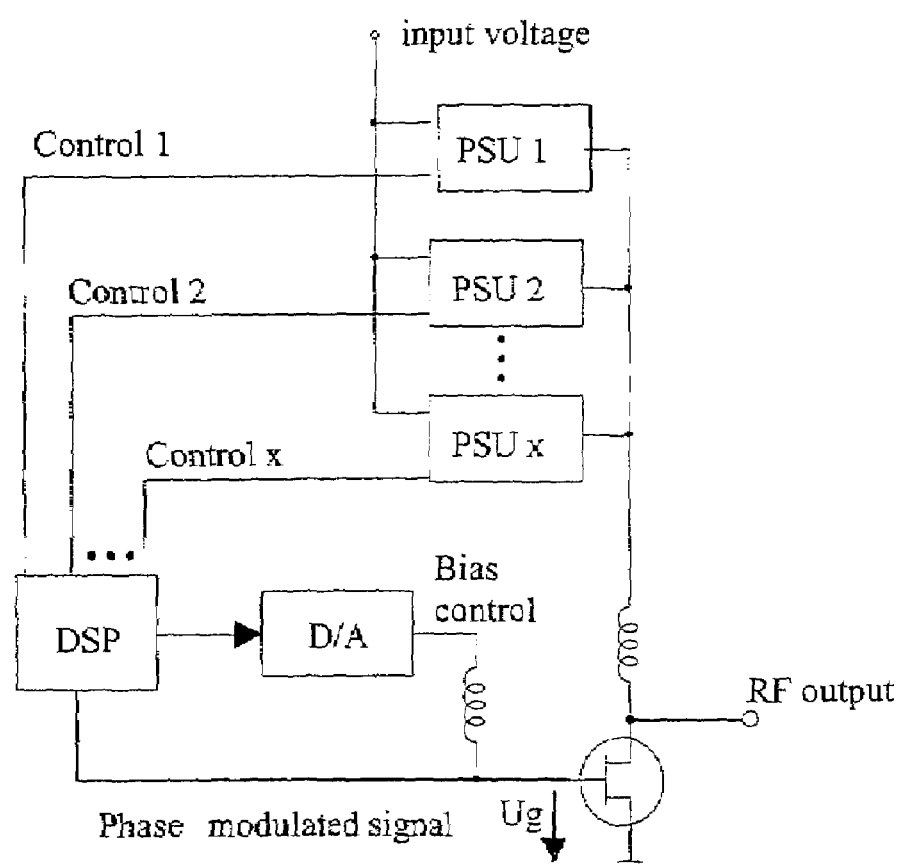
FIG. 3 is a block diagram showing the principle concept of the inventive approach using a variable bias voltage at the control input for the reconstruction of the amplitude content.

Regarding the advantageous but exemplar inventive embodiments, such a conversion process may be done with help of a limiter or, as depicted in FIG. 1 and FIG. 3, with the help of modern signal processing at the baseband frequency using a digital signal processor DSP to which the baseband is fed (not depicted in FIG. 1 and FIG. 3).

Then conventionally, at the last stage of the amplifier chain the amplitude part of the original input signal should be reconstructed by changing the supply voltage of the final stage amplifier. Hence, to be able to do this, a very fast power supply is needed that is able to follow the envelope of the original signal.

For example, for an UMTS signal, the frequency of the envelope can be as high as 5 MHz. Additionally this power supply must be high efficient to not degrade the efficiency of the whole amplifier unit including the power supply. For this reason switching DC/DC converters should advantageously be used as power supply.

In comparison to this known state of the art, the inventive approach uses a plurality of fixed power supply units PSU 1, PSU 2, PSU x for applying, based on the exemplar embodiments of FIG. 1 and FIG. 3, fixed output voltages in parallel to the amplifier, wherein each of the power supply units has a different output voltage, resulting in an enhanced improvement, according to the following description.

Hence by advantageously using DC/DC converters as power supply units, the power supply units PSU 1, PSU 2 and PSU x respectively provided with an input voltage can be optimized very easy for a certain behavior, such as efficiency and load regulation, as they need to output, according to the inventive approach only a fixed voltage. However, it is noted, that also fixed supply currents can be used depending of the respective amplifier type.

The advantageous DC/DC converters PSU 1, PSU 2 and PSU x supplying the amplifier with the necessary DC power are not used to reconstruct the amplitude part of the original input signal which have to be amplified by continuously changing the amplifier supply voltage according to the amplitude content of the original input signal. Thus, the power supply units PSU 1, PSU 2 and PSU x are used to effectively provide the amplifier with various fixed supply voltages to increase the amplifier efficiency in particular for lower output power levels.

Accordingly, the lower the power at the amplifier output indicated in FIG. 1 and FIG. 3 by the reference sign RF output, the lower must be the fixed supply voltage. As a consequence, to gain an efficiency enhancement from this inventive approach at least two different fixed supply voltages have to be used, i.e. one high supply voltage, provided for example by the power supply unit PSU 1, for getting the rated maximum output power from the final stage and one lower supply voltage, provided for example by the power supply unit PSU 2, for achieving an efficiency improvement for lower output power levels.

Figure 2:
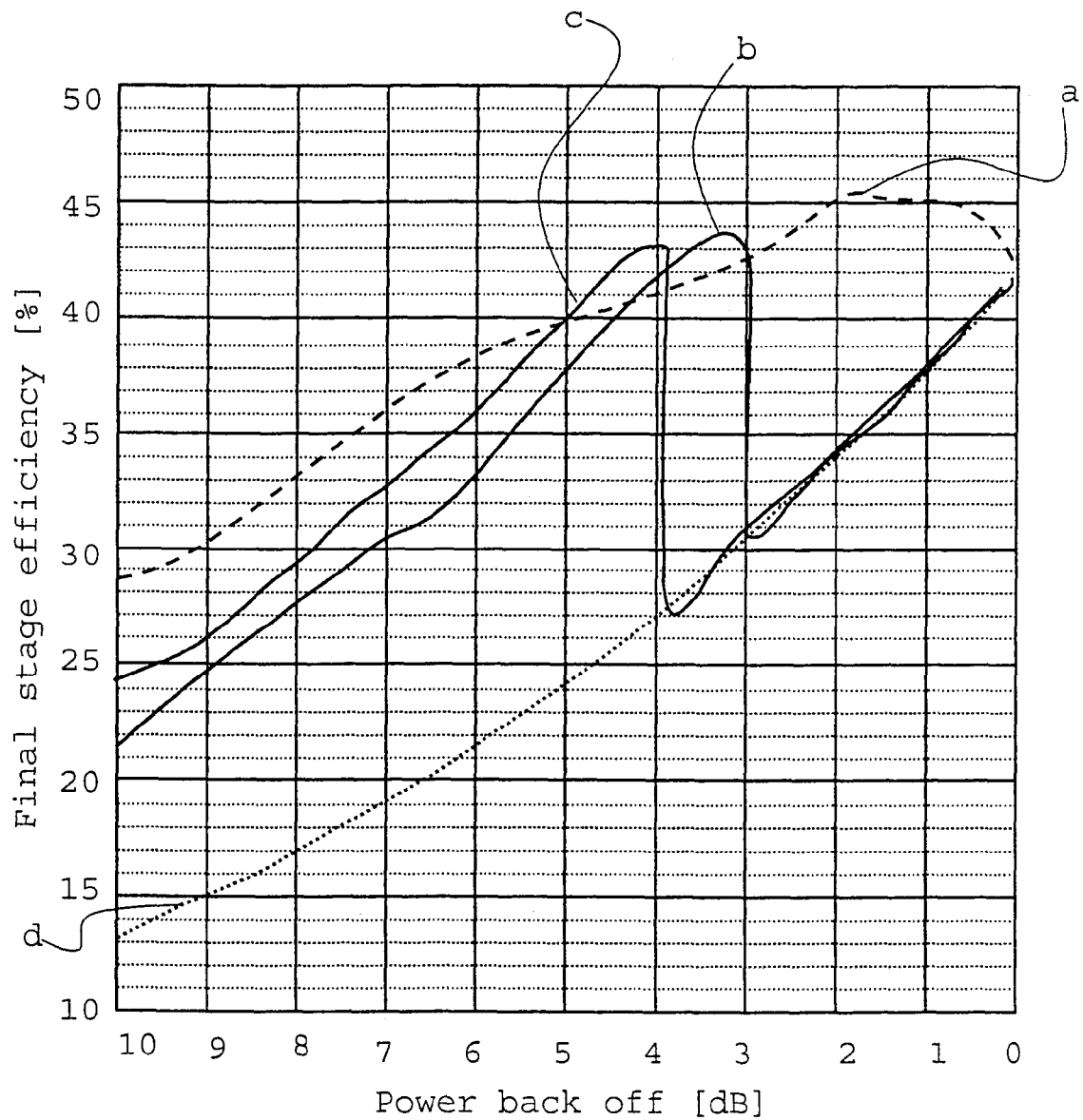
FIG. 2 is a diagram showing the achievable improvement in efficiency, based on the concept according to FIG. 1, over a traditional operated amplifier and the deterioration over the known EER technique.
Figure 4:
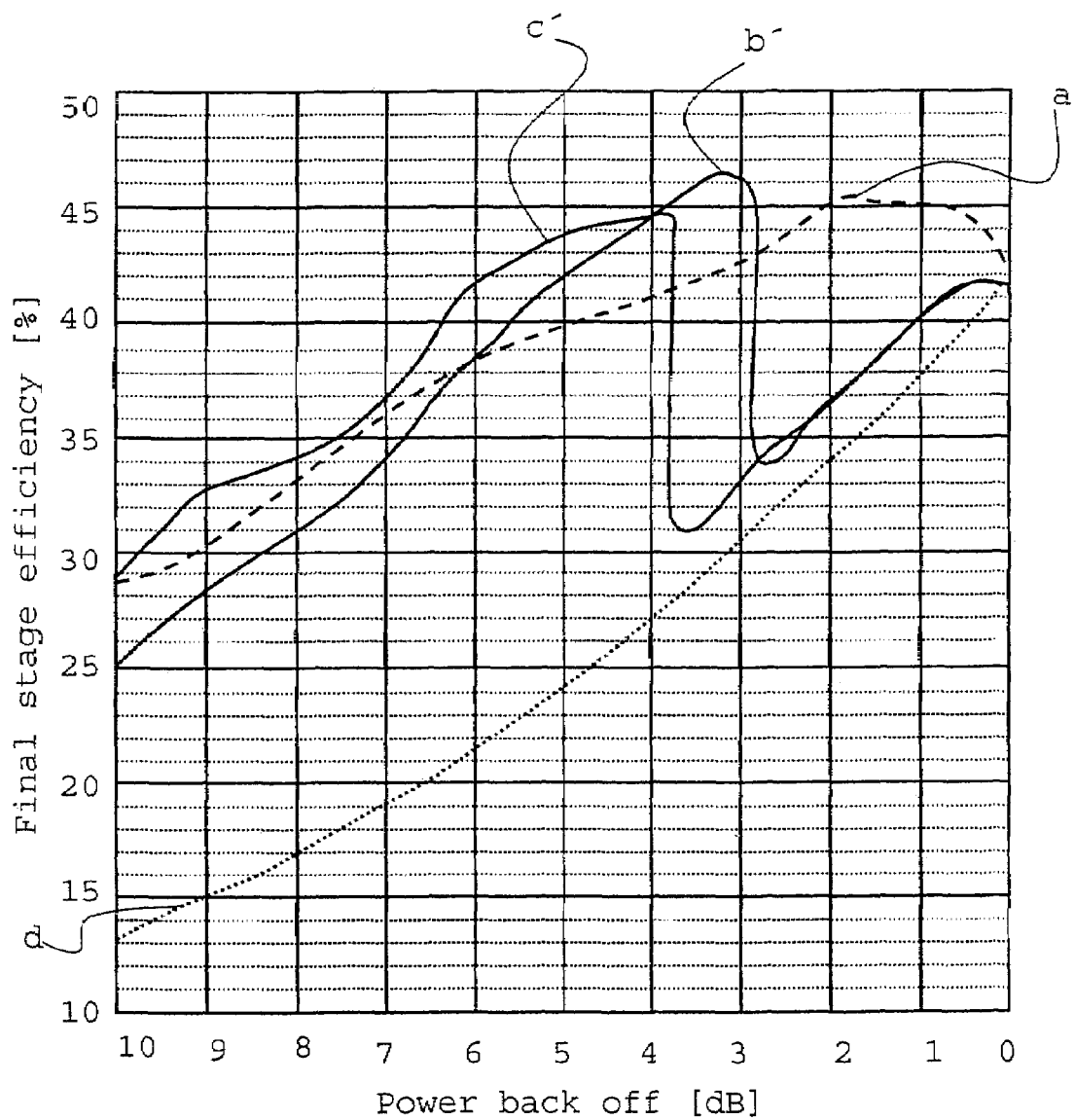
FIG. 4 is showing the change in efficiency, based on the concept according to FIG. 3, over a traditional operated amplifier and an amplifier that is operated as proposed in the known EER concept.

In this regard, the lower fixed supply voltage is used beginning at a certain power back-off, such as for example at a 3 dB to 4 dB power back-off, as depicted in FIG. 2 and FIG. 4 respectively by the graphs b or b' (3 dB back-off) and c or c' (4 dB back-off), and subsequent to lower output power levels. In practice, the specific power back-off may depend on the application specific peak to average power ratio of the original input signal converted into the phase modulated signal part and the amplitude modulated signal part.

Moreover, the value of the lower supply voltage advantageously depends on the characteristics of the original input signal, in particular on the efficiency improvement, which have to be achieved for a certain power back-off, and on the characteristics of the amplifier itself.

Hence, it is proposed to use for each fixed supply voltage an extra power supply unit PSU 1, PSU 2, PSU x, such as the advantageous DC/DC converters, that is optimized in efficiency and performance for the respective fixed supply voltage. The amplifier, as can be seen in FIG. 1 and FIG. 3, then is supplied with the desirable different voltages by switching those voltages by means of the digital signal processor DSP providing for each power supply unit PSU 1, PSU 2 and PSU x an individual control signal Control 1, Control 2 or Control x for the respective switching proposes, in particular based on the aforementioned dependencies.

Accordingly, the DC/DC converter output voltages are stabile and available when needed, i.e. either the power supply units PSU 1, PSU 2 and PSU x are running all the time or they are switched on when needed and switched off when not needed.

Since the amplifier supply voltage according to the inventive approach is not changed continuously according to the amplitude content of the original input signal problems with regard to a lack of speed are avoided.

In this regard it is worth to mention that by using a DC/DC converter as power supply even to fulfill the requirement for high efficient power supply, such requirement for speed usually cannot be met as the state of the art switched power supplies operate at maximum 1 MHz. The switching frequency however, should be at least about three times of the maximum envelope frequency, which can be as high as 5

MHz for an UMTS signal. On the other hand side if a conventional linear regulator is used, the requirement for speed could be met but the requirement for high efficiency is violated, as the voltage drop at the linear regulator would result in dissipated heat, resulting in almost no efficiency improvement of the complete amplifier unit including the power supply.

Based on the inventive approach, that the amplifier supply voltage is not changed continuously according to the amplitude content of the original input signal, the amplitude content of the original signal is advantageously reconstruct according to the following description.

Based on FIG. 1 for each fixed supply voltage provided by the respective selected power supply unit PSU 1, PSU 2 and/or PSU x the power level $P_{in}$ of the original input signal is changed by means of the digital signal processing unit DSP in that way, that the amplitude content of the original signal is reconstructed at the amplifiers unit output. Thereby the differences in the amplifier gain are taken into account when switching between the different supply units PSU 1, PSU 2, PSU x.

As an exemplar illustration for this inventive reconstruction approach, FIG. 2 is depicting obtainable final stage efficiencies over power back off in comparison to known approaches, wherein the graph a is representing the efficiency of an non-linear amplifier according to the known EER concept and the graph d is representing the efficiency of a common amplifier design where the amplifier is operated at one fixed supply voltage, for example at 26 V.

The graphs b and c in FIG. 2 respectively represents the final stage efficiencies based on the inventive switched amplifier supply approach with an exemplar switching at the 3 dB power back-off or at the 4 dB power back-off and by providing a variable power input level $P_{in}$ of the original signal to reconstruct the amplitude content. As can be seen from FIG. 2, at a power back-off of approximately 8 dB the efficiency with regard to common amplifier designs increases from about 17% to at least 27%.

Accordingly, since the amplitude content of the original input signal, as can be seen in FIG. 1, is not removed but is only modified to compensate the different gains for different supply voltages, linear amplifiers are more suitable for this reconstruction approach, even if they offer lower efficiency values than non linear saturated amplifiers. In practice, however, an efficiency improvement can be gained anyhow compared to common amplifier designs, forming the basis of the graphs d of FIGS. 2 and 4, where the amplifiers is operated at one fixed supply voltage.

Regarding next the very advantageous embodiment with regard to the reconstruction according to FIG. 3, the amplitude of the original input signal is reconstructed at the final amplifier unit output by changing the amplifier biasing voltage $U_g$ at the control input. It is noted that it depends on the type of the amplifier used whether the amplifier biasing voltage or current has to be changed.

Thereby the differences in the amplifier gain in turn are taken into account when switching between the different supply voltages, i.e. the different supply units PSU 1, PSU 2, PSU x. Furthermore, the varying of the amplifier biasing signal can be easily realized by using a fast and low efficient linear regulator as the DC powers necessary for the biasing purpose are much lower than those DC powers necessary for supplying the amplifier. For example the biasing DC power for a FET as amplifier unit as depicted in FIG. 3 is almost zero, as FET's do not draw current at the gate.

Moreover, the level of the phase modulated signal at the amplifier input is advantageously chosen such that the amplifier is not overdriven. This ensures in particular, that at one hand an improvement in efficiency is gained and that on the other hand the necessary dynamics at the output is achievable.

As an illustration for this inventive reconstruction approach, FIG. 4 is depicting exemplar graphs b' and c' representing final stage efficiencies over power back off based on the variability of the biasing voltage $U_g$ to reconstruct the amplitude content according to FIG. 3 in comparison to known approaches. The exemplar switching of the amplifier supply is at the 3 dB power back-off with regard to graph b' and at the 4 dB power back-off with regard to graph c'.

As known approaches, in turn graph a is representing the efficiency of the non-linear amplifier according to the known EER concept and graph d is representing the efficiency of the common amplifier design with the fixed supply voltage at 26 V.

As can be seen for example from FIG. 4, at a power back-off of approximately 8 dB the efficiency with regard to the common amplifier designs increases from about 17% to at least 31%.

As a consequence even if, as can be also seen for example from FIGS. 2 and 4, the achievable efficiency improvement may be lower for the inventive embodiments than with the known EER concept utilizing an efficient DC/DC converter with a variable supply voltage, the inventive approach always has the advantage of feasibility and practicability as the amplifier supply voltage is only switched between a set of fixed values, not continuously changed.

While the particular invention has been described with reference to illustrative embodiments, this description is not meant to be construed in a limiting sense. It is understood that although the present invention has been described, various modifications of the illustrative embodiments, as well as additional embodiments of the invention, will be apparent to one of ordinary skill in the art upon reference to this description without departing from the spirit of the invention, as recited in the claims appended hereto. Consequently, processing circuitry required to implement and use the described may be implemented in application specific integrated circuits, software-driven processing circuitry, firmware, programmable logic devices, hardware, discrete components or arrangements of the above components as would be understood by one of ordinary skill in the art with the benefit of this disclosure. Those skilled in the art will readily recognize that these and various other modifications, arrangements and methods can be made to the present invention without strictly following the exemplary applications illustrated and described herein and without departing from the spirit and scope of the present invention It is therefore contemplated that the appended claims will cover any such modifications or embodiments as fall within the true scope of the invention.

The invention claimed is:

1. A method of performing power amplification under variable envelope excitation, comprising the steps of:
converting an original input signal at least into a phase modulated signal part;
feeding at least the phase modulated signal part to an input port of an amplifier unit; and
amplifying said at least the phase modulated part of said original input signal by dynamically selecting a plurality of fixed power supply units for the amplifier unit, each fixed power supply unit having a different fixed output power, wherein the amplitude of the original input signal is recreated by the dynamic selection of the power supply units so as to change a further controllable input signal to the amplifier unit, in particular at least one of input power level, biasing voltage and biasing current, of the further controllable input signal supplied to a control input of the amplifier unit, during said step of amplifying.

2. The method of claim 1, further characterized in that the dynamical selection of the fixed power supply unit(s) provides different fixed supply currents or supply voltages.

3. The method of claim 1, further comprising the step of compensating non-linearity by at least one of pre-distorting the power supply for the amplifier unit and pre-distorting the amplifier unit biasing voltage or biasing current at the control input.

4. The method of claim 1, further comprising the step of lowpass filtering of a control signal for providing at least one of a changeable amplifier unit biasing voltage and a biasing current at the control input with a cut-off frequency close to a modulation bandwidth of the original input signal.

5. The method of claim 1, further comprising the step of converting the original input signal into an amplitude modulated signal part, according to which the input power level is changed.

6. A power amplifier comprising:
at least a final amplifier unit;
means for feeding at least a phase modulated signal part of an original input signal to an input port of the final amplifier unit;
at least two selectable power supply units with different fixed output powers connected to a supply port of the final amplifier unit;
means for dynamically selecting a total supply power by selecting the respective power supply units; and
means for controlling an input signal to the final amplifier circuit by changing the selected supply power units, in particular at least one of input power level, biasing voltage and biasing current.

7. The power amplifier of claim 6, wherein each of the power supply units either comprises a DC/DC converter or is connected to the supply port in parallel or is selected by a common digital signal processor.

8. The power amplifier of claim 6, wherein a linear regulator is used to control at least one of biasing voltage and biasing current at the input to the amplifier, and wherein a control path includes a lowpass filter for controlling the biasing voltage or biasing current.

* * * * *